United States Patent [19]

Kawauchi

[11] Patent Number: 5,277,356

[45] Date of Patent: Jan. 11, 1994

[54] WIRE BONDING METHOD

[75] Inventor: Takanobu Kawauchi, Kyoto, Japan

[73] Assignee: Rohm Co., Ltd., Kyoto, Japan

[21] Appl. No.: 72,932

[22] Filed: Jun. 8, 1993

[30] Foreign Application Priority Data

Jun. 17, 1992 [JP] Japan .................................. 4-157989

[51] Int. Cl.⁵ .......................................... H01L 21/607
[52] U.S. Cl. .................. 228/111; 228/173.5; 228/180.5
[58] Field of Search ...................... 228/110, 111, 173.5, 228/179, 263.17, 1.1, 6.2

[56] References Cited

U.S. PATENT DOCUMENTS

| 3,047,942 | 8/1962 | Schneider et al. | 228/111 |
| 4,294,392 | 10/1981 | Colloff | 228/111 |
| 4,580,713 | 4/1986 | Sekibata et al. | 228/111 |

FOREIGN PATENT DOCUMENTS

| 58-35950 | 3/1983 | Japan . | |
| 83352 | 4/1991 | Japan | 228/111 |

Primary Examiner—Samuel M. Heinrich
Attorney, Agent, or Firm—William H. Eilberg

[57] ABSTRACT

A method of bonding an end of an aluminum wire to a lead comprises the steps of: forming a plurality of parallel bonding grooves on a surface of the lead; pressing the wire end against the grooved surface of the lead with the wire end held in parallel to the bonding grooves; and applying ultrasonic vibration to the wire end in a direction parallel to the bonding grooves.

4 Claims, 4 Drawing Sheets

WIRE BONDING METHOD

BACKGROUND OF THE INVENTION

1. Field of the Invention

This invention relates generally to the wire bonding technology used for making electronic components. More specifically, the present invention relates to a method of bonding an aluminun wire for electrically connecting a between semiconductor chip and a lead or between a pair of leads.

2. Description of the Prior Art

As is well known, leadframes are commonly used for manufacturing various electronic components such as transistors, ICs, and etc. The leadframe, which is an integral piece made of a thin metal sheet, includes a plurality of chip mounting portions each for mounting a semiconductor chip, and a plurality of leads associated with the respective chip portions. After mounting the chip, a thin metal wire is bonded to the chip and to a corresponding lead of the leadframe, and a resinous package is molded to enclose the chip together with the wire and part of the lead.

When the metal wire is made of gold or copper, the bonding of the wire is performed by the so-called thermo compression bonding method wherein an end of the wire is pressed against the workpiece (namely, the chip or the lead) while heating to a relatively high temperature. If necessary, ultrasonic vibration may be additionally applied to the wire end to increase the bonding strength.

When the metal wire is made of aluminum, on the other hand, it is known that the positive application of heat causes weakening of the wire. Further, it is also known that the aluminum wire is easily oxidized by the positive application of heat. In view of this, the bonding of the aluminum wire has been conventionally performed by the so-called ultrasonic bonding method wherein an end of the aluminum wire is pressed against the workpiece under the application of ultrasonic vibration but without positive application of heat. In such a bonding method, heat is generated only frictionally at the position of contact between the workpiece and the ultrasonically vibrated wire end, and the thus generated heat causes bonding of the wire relative to the workpiece.

It has been found that the ultrasonic wire bonding method provides a weaker bonding strength as the surface roughness of the workpiece increases. In other words, if the surface roughness of the workpiece is high, the wire end, which has been ultrasonically bonded, may easily come off the workpiece.

Particularly, the leadframe as the workpiece is known to have an innumerable number of sharply edged slip lines (Lüders' lines) which are formed at the time of rolling a metal sheet material, thereby increasing the surface roughness of the leadframe. If the wire end is ultrasonically vibrated in a direction transversing the slip lines, the wire end is subjected t material removal by the abrasive action of the slip lines. Therefore, care must be taken to render the direction of the ultrasonic vibration parallel to the extending direction of the slip lines, consequently reducing the designing freedom.

In view of these problems, Japanese Patent Application Laid-open No. 58-35950 discloses a leadframe which is plated with nickel to have a surface roughness of no more than 0.5 micrometers, thereby preventing a bonding strength decrease which would result from an increase of the surface roughness provided by the presence of the slip lines. However, the plating treatment is excessively time-taking and costly if performed to the degree of achieving a surface of roughness of no more than 0.5 micrometers.

SUMMARY OF THE INVENTION

It is, therefore, an object of the present invention to provide an improved ultrasonic wire bonding method which enables an aluminum wire to be strongly and reliably bonded to a lead without a need for plating the lead.

According to the present invention, there is provided a method of bonding an end of an aluminum wire to a lead, the method comprising the steps of: forming a plurality of parallel bonding grooves on a surface of the lead; pressing the wire end against the grooved surface of the lead with the wire end held in parallel to the bonding grooves; and applying ultrasonic vibration to the wire end in a direction parallel to the bonding grooves.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 1:
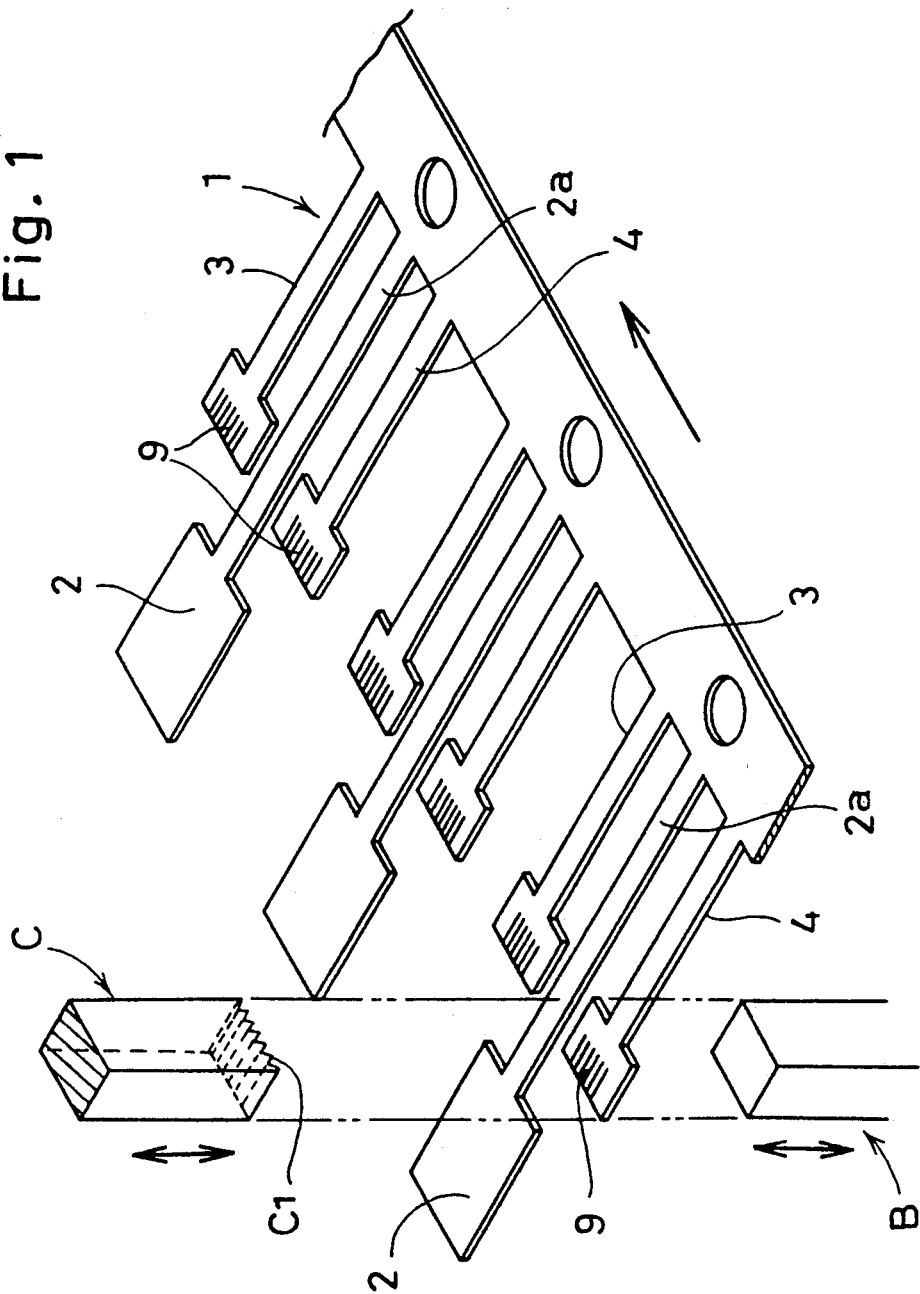
FIG. 1 is a perspective view showing a leadframe used for performing a wire bonding method according to the present invention.

FIGS. 1 through 5 of the accompanying drawings show a leadframe 1 which is used for making transistors for example. A wire bonding method according to the present invention is applicable to such a leadframe.

The leadframe 1, which is substantially continuous, is prepared by rolling a metal material into a thin sheet and then punching the sheet into a predetermined form. The leadframe is formed integrally with multiple groups of three leads spaced longitudinally of the leadframe at a suitable interval. Each group of leads include a first lead 2a having an integral chip mounting portion 2, a second lead 3 arranged on one side of the first lead 2a, and a third lead 4 arranged on the other side of the first lead 2a.

As clearly appreciated from FIG. 1, the respective groups of lead 2a, 3, 4 are identical in configuration and undergo an identical manufacturing process. Thus, for the convenience of description, reference is only made to one group of leads 2a, 3, 4.

For manufacture, the leadframe 1 is transferred longitudinally. During such transfer of the leadframe, each of the second and third leads 3, 4 is compressed between a support die B and a forming die C. The forming die C has a lower end formed with a plurality of parallel coining serrations Cl, so that a corresponding number of parallel bonding grooves 9 are formed on the lead 3 or 4.

Figure 4:
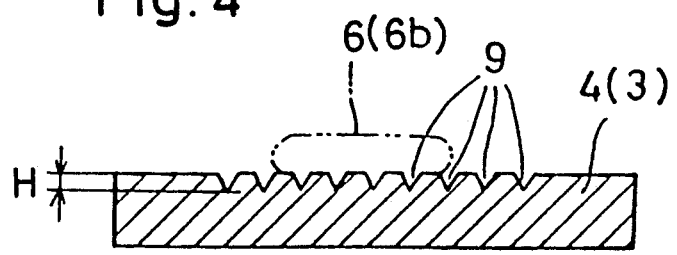
FIG. 4 is an enlarged sectional view taken along lines IV—IV in FIG. 2.

The bonding grooves 9 are far larger in depth than the surface roughness provided by the slip lines inherently present on the surfaces of the leadframe 1 (FIG. 4). As a result, the orientation of the bonding grooves 9 predominates or prevails over that of the surface slip lines of the leadframe 1. Thus, as opposed to the prior art, there is no need to provide a nickel plating for improving the surface smoothness of the leadframe. Further, even if such plating is provided on the leadframe 1, the degree of plating need not be such as to provide a surface roughness (smoothness) of not more than 0.5 micrometers.

Figure 3:
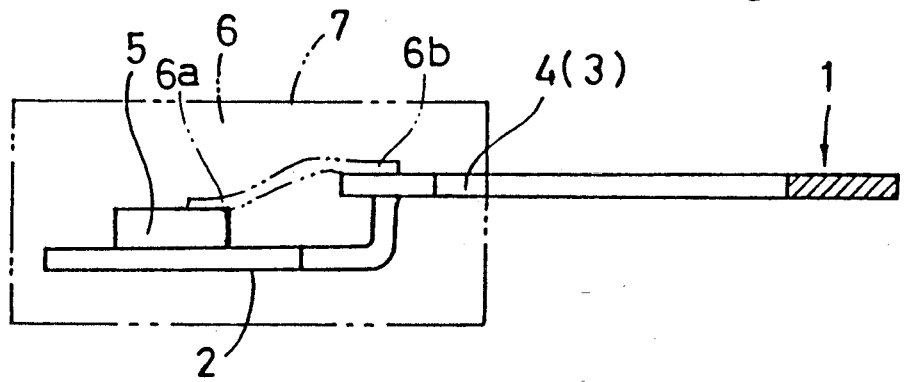
FIG. 3 is a sectional view taken along lines III—III in FIG. 2.

After the formation of the bonding grooves 9, the first lead 2a is bent near the chip mounting portion 2 so that the chip mounting portion 2 is positioned lower than the second and third leads 3, 4, as shown in FIG. 3.

Figure 2:
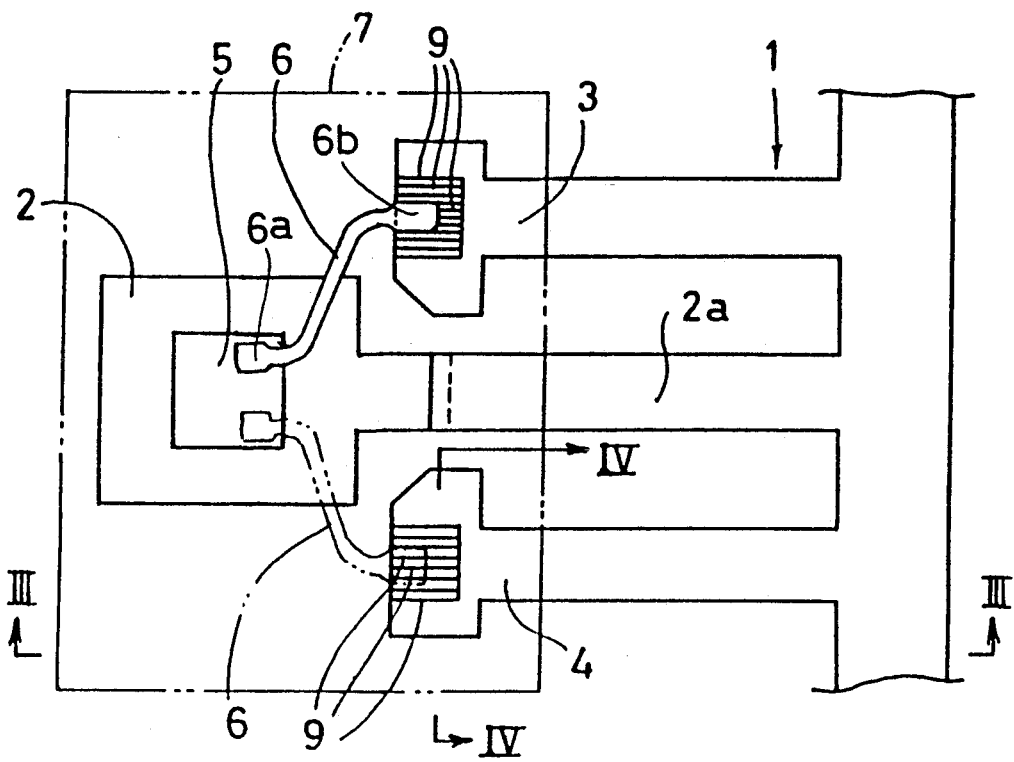
FIG. 2 is an enlarged plan view of the same leadframe.

Then, a semiconductor chip 5 is bonded on the chip mounting portion 2, and the chip 5 is electrically connected to the second and third leads 3, 4 through separate aluminum wires 6 (FIG. 2).

Finally, a resinous package 7 is molded to enclose the semiconductor chip 5 and its associated parts (FIGS. 2 and 3), and the respective leads 2a, 3, 4 are separated from the leadframe 1 to provide a product transistor.

The process for bonding each aluminum wire 6 to the corresponding lead 3, 4 includes a first bonding step for bonding one end 6a (first end) of the wire 6 to the semiconductor chip, and a second bonding step for bonding the other end 6b (second end) of the wire 6 to the lead 3, 4. Each of the first and second bonding step is performed according to the so-called "ultrasonic bonding method".

Specifically, in the first bonding step, the first end 6a of each wire 6 is pressed against the chip 5 by a bonding tool 8 (FIG. 5) which has been vertically lowered, and the bonding tool 8 is ultrasonically vibrated. In the second bonding step, similarly, the second end 6b of the wire 6 is pressed against the corresponding lead 3, 4 by the bonding tool 8 (which has been previously moved to the position of the lead), and the bonding tool 8 is ultrasonically vibrated.

Figure 5:
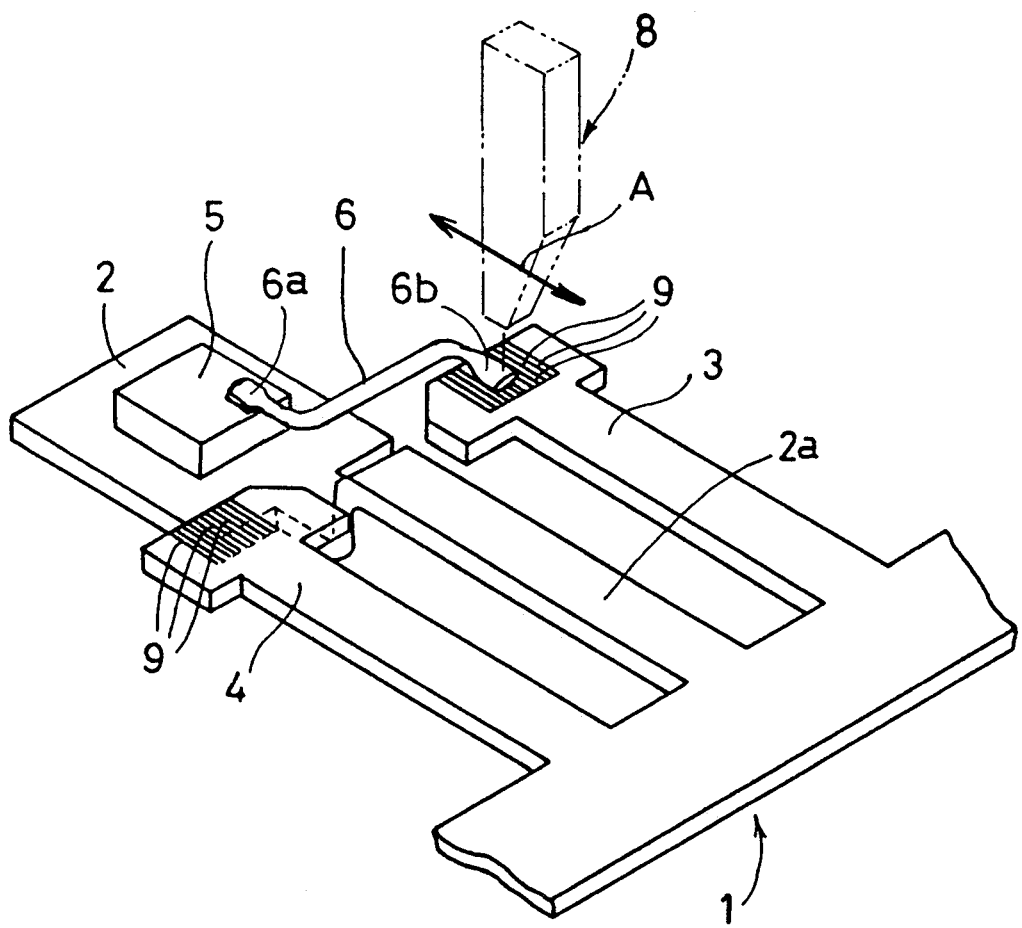
FIG. 5 is a perspective view showing how the wire bonding method according to the present invention is performed.

In the second bonding step of the wire bonding method according to the present invention, the second end 6b of each wire 6 is oriented parallel to the bonding groove 9 of the corresponding lead 3, 4, and the bonding tool 8 is ultrasonically vibrated in the direction parallel to the bonding grooves 9, as indicated by an double-headed arrow in FIG. 5. As a result, the second end 6b of the wire 6 is compressively deformed into engagement with the bonding grooves 9 without material removal which would be caused by the bonding grooves 9 if the bonding tool 8 is vibrated transversely thereto, and the heat generated by the application of the ultrasonic vibration causes adhesion between the wire 6 and the bonding grooves 9. Obviously, the increased contact area provided by the bonding grooves 9 provides stronger and more reliable bonding of the wire 6 than conventionally achieved.

As described above, the direction of ultrasonic vibration (namely, the orientation of the second wire end 6b) need be rendered parallel to the bonding grooves 9 of the second and third leads 3, 4. However, since the bonding grooves 9 are formed after the preparation of the leadframe 1 by the use of dies B, C, the extending direction of the bonding grooves 9 may be optionally determined regardless of the slip line direction of the leadframe 1 to provide a desired orientation of the second wire end 6b which coincides with the vibrating direction of the bonding tool 8. Thus, there will be a larger degree of design freedom in performing the method of the present invention.

The present invention may be applied for making various electronic components other than the transistor described above. For instance, the invention may be applied to an integrated circuit wherein a semiconductor chip is electrically connected to multiple leads through respective aluminum wires. Further, the invention may be also applied for the making of safety fuse devices, as shown in FIG. 6.

Figure 6:
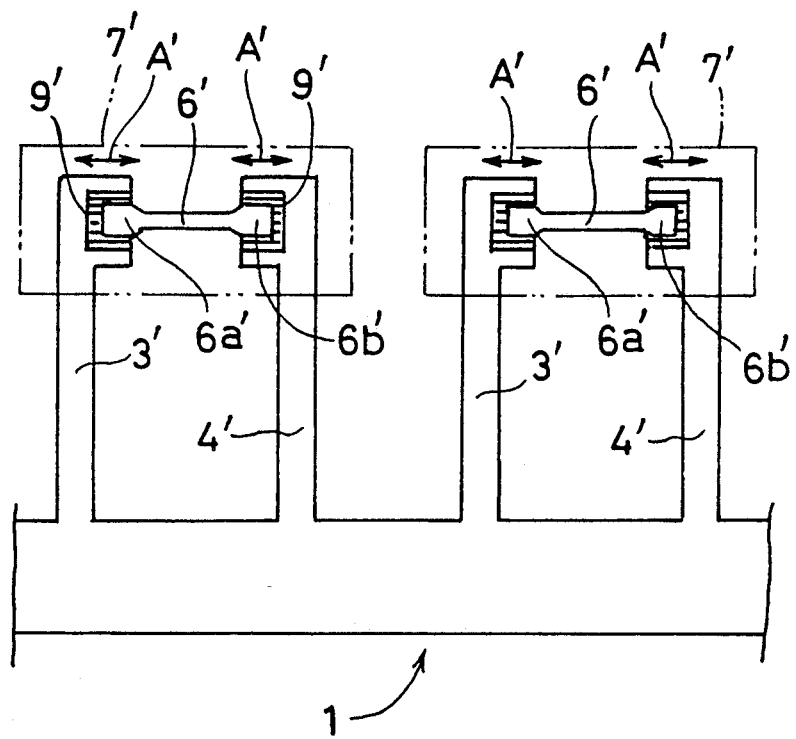
FIG. 6 is a plan view showing another leadframe used for performing a wire bonding method according to the present invention.

More specifically, as shown in FIG. 6, the safety fuse devices are made from a leadframe 1' which is integrally formed with pairs of leads 3', 4' each having a plurality of parallel bonding grooves 9'. An aluminum fuse wire 6', which functions as an overcurrent preventive fuse, connects between each pair of leads 3', 4', and a molded resinous package 7' encloses the fuse wire 6' together with part of the leads.

According to the embodiment of FIG. 6, each fuse wire 6' has a first and a second ends 6a', 6b' held to extend parallel to the bonding grooves 9' of the corresponding leads 3', 4', and a bonding tool (see the member 8 in FIG. 5) which is held in pressing contact with the wire end 6a', 6b' is ultrasonically vibrated in the direction along the bonding grooves 9' (see double-headed arrows A' in FIG. 6).

The present invention being thus described, it is obvious that the same may be varied in many ways. Such variations are not to be regarded as a departure from the spirit and scope of the the invention, and all such modifications as would be obvious to those skilled in the art are intended to be included within the scope of the following claims.

I claim:

1. A method of bonding an end of an aluminum wire to a lead, the method comprising the steps of:

forming a plurality of parallel bonding grooves on a surface of the lead;

pressing the wire end against the grooved surface of the lead with the wire end held in parallel to the bonding grooves; and applying ultrasonic vibration to the wire end in a direction parallel to the bonding grooves.

2. The method according to claim 1, wherein the lead is an integral part of a leadframe, the other end of the aluminum wire being bonded to a semiconductor chip mounted on the leadframe.

3. The method according to claim 1, wherein the lead is an integral part of a leadframe, the other end of the aluminum wire being bonded to another lead also integral with the leadframe.

4. The method according to claim 1, wherein the bonding grooves of the lead surface are formed by clamping the lead between a support die and a forming die, the forming die having an end face formed with a plurality of parallel coining serrations.

* * * * *